United States Patent [19]

Danilin et al.

[11] 4,199,818

[45] Apr. 22, 1980

[54] ELECTRICAL CONNECTION MATRIX PLANE

[76] Inventors: Jury I. Danilin, ulitsa Savushkina, 9, kv. 64; Konstantin A. Maringulov, ulitsa Lomonosova, 12, kv. 68; Evgeny N. Pavlov, Lesnoi prospekt, 32, kv. 8, all of Leningrad, U.S.S.R.

[21] Appl. No.: 787,263

[22] Filed: Apr. 13, 1977

Related U.S. Application Data

[63] Continuation of Ser. No. 604,076, Aug. 12, 1975, abandoned.

[51] Int. Cl.$^2$ ............................................... H01F 7/06
[52] U.S. Cl. .......................................... 365/70; 365/63
[58] Field of Search ..................................... 365/70, 63

[56] References Cited

U.S. PATENT DOCUMENTS

| | | | |
|---|---|---|---|
| 3,377,581 | 4/1968 | Boles et al. | 365/70 |
| 3,390,384 | 6/1968 | Davis | 365/70 |
| 3,414,666 | 12/1968 | Doundolakis et al. | 365/70 |
| 3,535,690 | 10/1970 | Reimer | 365/70 |

FOREIGN PATENT DOCUMENTS

| | | | |
|---|---|---|---|
| 1082641 | 6/1960 | Fed. Rep. of Germany | 365/70 |
| 1085207 | 7/1960 | Fed. Rep. of Germany | 365/70 |

*Primary Examiner*—Marshall M. Curtis
*Attorney, Agent, or Firm*—Haseltine, Lake & Waters

[57] ABSTRACT

An electrical woven electrical connection matrix plane intended primarily for switching electric signals in electronic circuits, which is made from interwoven insulation threads and X and Y current conductors, the X and Y current conductors at intersections being located on different surfaces of an insulation field formed by the interwoven insulation threads. At preset intersections there are disposed contact nodes formed by interwoven X and Y current conductors brought out at one surface of the insulation field, and at least one of the plane sections is provided with a loose hanging layer of several adjacent current conductors extended along one axis which is positioned over the interwoven insulation threads and current conductors extended along the other axis.

6 Claims, 14 Drawing Figures

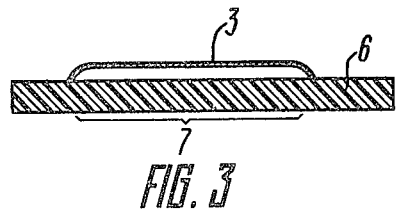
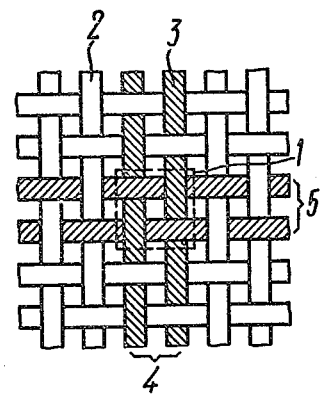
FIG. 1
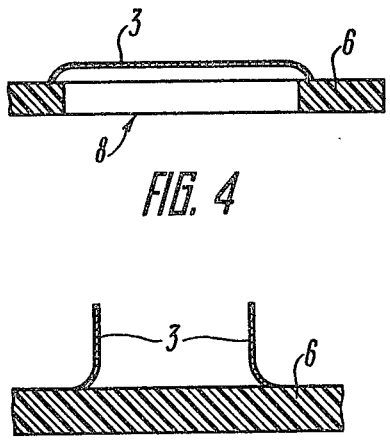
FIG. 3
FIG. 4
FIG. 5
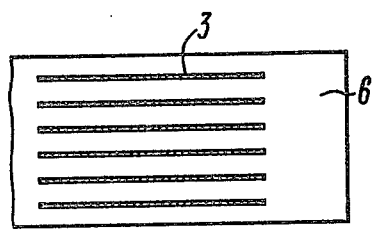
FIG. 2
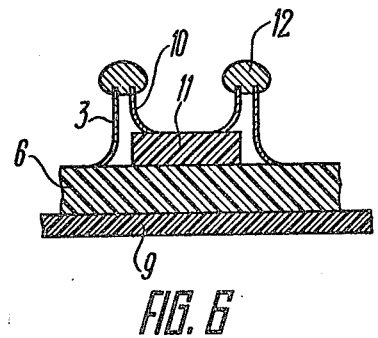
FIG. 6

ELECTRICAL CONNECTION MATRIX PLANE

The present application is a continuation of the parent application Ser. No. 604,076 filed Aug. 12, 1975, now abandoned.

The present invention relates to switching facilities and more particularly to an electrical woven X-Y electrical connection matrix plane used in electronic equipment for switching electric signals.

A prior-art electrical connection matrix plane is made from interwoven insulation threads and X and Y current conductors forming groups each of which consists of at least two parallel X or Y conductors.

Each group of current conductors is disposed so as to intersect the insulation field formed by interwoven insulation threads in an alternating direction, i.e. every conductor does out of and into the field alternately. At intersections, groups of X and Y current conductors are disposed on different sides of said insulation field, and only at predetermined points where electrical contact is required between appropriate groups of X and Y conductors there are provided contact nodes in the form of a mesh produced by interwoven current conductors from respective X and Y groups of conductors brough out at the same surface of the insulation field.

This known electrical connection matrix plane is designed for switching electric signals injected and taken off through contact terminals disposed along the perimeter of the electrical connection matrix plane and connected to groups of X and Y current conductors.

However, it is sometimes necessary to arrange circuit elements and connect their terminals to the contact terminals of a electrical connection matrix plane not only along the perimeter, but also on the entire surface thereof.

In the known electrical connection matrix plane there are no contact terminals on the plane area which is its serious drawback.

Another drawback is that separation of current conductors from insulation threads extended in the same direction is a laborious operation which is performed after the electrical connection matrix plane has been manufactured on a loom; besides, the subsequent operation, i.e. removal of these insulation threads and making contact terminals from the current conductors, is also very complicated.

At present major emphasis is laid on selective elimination or minimizing of stray currents that occur in moderne electric circuits employing a known type of electrical connection matrix plane.

In the known electrical woven matrix it is not possible to eliminate stray currents induced by one group of current conductors in the other group of current conductors which may also be considered a drawback of this known electrical connection matrix plane that narrows the range of its applicability in up-to-date electronic circuits.

Still another drawback of the known electrical connection matrix planes lies in that its manufacture process involves technological difficulties associated with different adjustment modes and characteristics of weaving equipment required to make current conductors from metal and insulation threads having different mechanical characteristics.

It is not feasible to attain such different adjustment modes and characteristics on one loom, therefore, when manufacturing known electrical connection matrix planes, the average operating mode and adjustment characteristics are selected which are for this reason far from being optimum.

In the known electrical connection matrix plane, it is not possible to connect circuit element terminals with the contact nodes of the memory plane in cases when connection and splicing of circuit elements located over the plane area are accomplished by a flash soldering.

Connection by flash soldering is inaplicable because the known electrical connection matrix plane does no provide for passage of the terminals of circuit elements through the insulation field of the electrical connection matrix plane.

In view of the above, it is an object of the present invention to provide an electrical connection matrix plane in which the terminals of the circuit elements can be connected to the contact terminals of the electrical connection matrix plane not only along the perimeter, but also throughout the area thereof.

It is another object of the invention to provide an electrical connection matrix plane which obviates the need for a laborious manual operation of detaching current conductors from insulation threads running in the same direction and none the less laborious operation of removing these threads and making contact terminals of the electrical connection matrix plane from the current conductors.

It is a further object of the invention to provide an electrical connection matrix plane where stray currents induced by current conductors of one group in current conductors of the other group are either partially eluminated or minimized.

It is a still further object of the invention to provide an electrical connection matrix plane made from insulation threads and current conductors with similar mechanical parameters so as to enable optimum adjustment characteristics of weaving equipment.

Finally, it is an object of the invention to provide an electrical connection matrix plane in which the terminals of the circuit elements disposed over the plane area are connected to the contact nodes of the electrical connection matrix plane through flash soldering.

With the foregoing and other objects in view, there is provided an electrical connection matrix plane made from interwoven insulation threads and X and Y current conductors forming groups, each of which consists of at least two parallel X or Y conductors and is disposed so as to intersect the insulation field formed by the insulation threads alternatingly, i.e. going into and from the field alternately, and wherein at intersections of the conductors, X and Y groups are located each on a different side of the insulation field, whereas at predetermined places where electrical contact is required between respective groups of X and Y conductors there are provided contact modes in the form of a mesh made by interweaving of respective groups of X and Y conductors brought out at the same surface of the insulation field, and wherein, according to the invention, some groups of X or Y conductors intersect and insulation field so that after leaving the field, the group of conductors reenters the insulation field by-passing several groups of conductors extending at 90° thereto and forms a layer of parallel conductors disposed above the insulation field which is made of X and Y insulation threads interwoven with several said groups of conductors extending at 90° to the former group of conductors.

It is preferable that at least one current conductor at a contact node site is made as a loop disposed somewhat higher than the contact node.

It is also rather advisable that parallel to groups of current conductors which must be shielded are laid additional insulated current conductors arranged in a pattern repeating the interweaving pattern of the conductors to be shielded.

It is advisable that current conductors are made of insulation threads impregnated with a current conducting compound.

It has been further found advantageous that during general weaving of insulation threads and current conductors insulation threads not included in the general interweaving pattern are passed through the centres of contact nodes and then these thread are taken out so as to make ports for electric terminals of circuit elements.

Such an electrical connection matrix plane makes it possible to dispose circuit elements not only along the perimeter, but also over the entire area thereof, contact terminals on the plane being such as to enable connection of circuit elements with both planar and end face arrangement of terminals.

The technology of making such an electrical connection matrix plane is improved due to elimination of manual operations of selection and cutting-out of each insulation thread running parallel to the current conductors.

Required groups of current conductors are shielded due to the use of weaving additional insulated current conductors into an electrical connection plane; besides, current conductors and insulation threads have similar mechanical characteristics which permits optimizing operating parameters of weaving equipment.

The foregoing and other objects and features of this invention will be better understood from a consideration of the detailed description of specific embodiments thereof when taken in conjunction with the accompanying drawings in which:

FIG. 1 is a plan fragmentary view of an electrical connection matrix plane at a contact node site, according to the invention;

FIG. 2 is a schematic illustration of arrangement of a layer of current conductors relative to the insulation field, according to the invention as viewed from above;

FIG. 3 is a side view of the same;

FIG. 4 is a side view of the arrangement of a layer of currentc conductors relative to the insulation field, with a cut-out portion of the insulation field positioned under said layer of current conductors, according to the invention;

FIG. 5 is a side view of two rows of contact terminals of an electrical connection matrix plane which are formed by cutting a layer of current conductors in two, according to the invention;

FIG. 6 is a side view of a circuit element connected to electrical connection matrix plane terminals, according to the invention;

Figure 12:
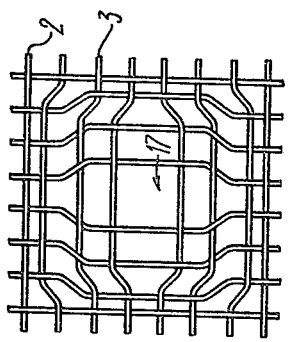
FIG. 12 is a plan view of a portion of an electrical connection matrix plane with a port at a contact node site, according to the invention.

Considered below is a concrete preferred embodiment of an electrical connection matrix plane according to the invention.

FIG. 1 is a fragmentary view of an electrical connection matrix plane portion where a contact node 1 is disposed.

It can be seen from the figure that an electrical connection matrix plane is made of insulation threads 2 interwoven with X and Y current conductors 3. The current conductors 3 extended along each coordinate axis formg groups 4 and 5, each consisting of at least two parallel wires 3 extended along one axis, with any number of the conductors 3 in one group 4 or 5.

At predetermined points of the electrical connection matrix plane where electric contact is required between the respective groups 4 and 5 of the X and Y conductors, 3, there are provided contact nodes I in the form of a mesh made by interweaving the wires 3 in the respective X and Y groups brought out at the same surface of the insulation field.

At other intersections of conductors, the current conductors 3 of the respective X and Y groups 4 and 5 are located on different sides of the insulation field formed by interweaving of the insulation threads 2.

Some groups 4 of the Y conductors 3, after leaving the field formed by the interwoven threads 2, reenter the field by-passing several groups 5 of the X current conductors.

Such an arrangement of the Y conductors 3 relative to an insulation field 6 is schematically represented in FIG. 2.

Thus a layer of the parallel current conductors 3 (FIG. 3) is formed so as to be disposed above a section 7 of the insulation field 6 produced by the insulation threads 2 (FIG. 1) interwoven with the groups 5 of the X conductors 3.

This section 7 (FIG. 3) can further be cut out, if so required, so that a port 8 (FIG. 4) is formed for passing a connector or a circuit element.

Moreover, a layer of the conductors 3 thus obtained which is not interwoven with the conductors extending along the other axis, can be cut in two so as to form two rows of contact terminals as shown in FIG. 5.

FIG. 6 illustrates part of an electrical connection matrix plane attached to a stiffener 9 and having two rows of contact terminals formed from the current conductors 3 cut in two.

Such terminals can be used for mechanical connection of terminals 10 of a circuit element II with subsequent soldering of the junction point with a solder 12.

The circuit element II is fastened on the insulation field 6 of the electrical connection matrix plane in the same way as circuit elements are attached to a printed-circuit board, i.e. the element II is passed to the field 6.

The formation of such a layer of the conductors 3 (FIG. 3) is also useful for making peripheral terminals of the electrical connection matrix plane.

At the edge of the electrical connection matrix plane is provided a layer of current conductors 3 which are interwoven at the very end with the insulation field 6.

Figure 7:
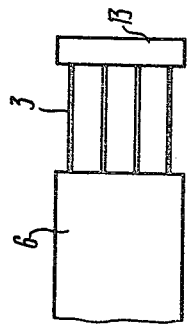
FIG. 7 is a plan view of an electrical connection matrix plane with peripherally disposed terminals, according to the invention.

The section 7 is cut out, while a strip 13 (FIG. 7) formed by the insulation threads interwoven with the current conductors 3 is preserved to serve for temporary fixation purposes and subsequently may be also cut off.

This makes redundant the operation of separating the current conductors 3 from the associated insulation threads since the latter form a separate insulation layer which may be cut out, if so required.

Figure 8:
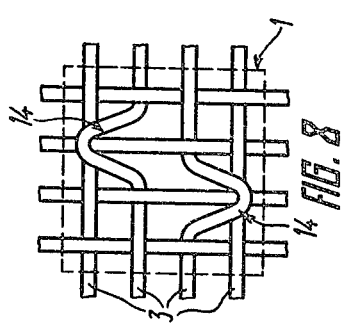
FIG. 8 is a plan view of a contact node of an electrical connection matrix plane with two loops, according to the invention.

FIG. 8 shows the contact node I made as a mesh of the interwoven current conductors 3.

At the node site, at least one of the current conductors 3 forming the node 1 is made in the form of a loop 14.

Figure 9:
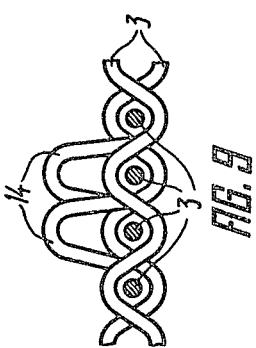
FIG. 9 is a side view of the same.

In this concrete embodiment of the invention, two current conductors 3 are not drawn tight into the woven pattern, but are left loose over the contact node I (FIG. 9) so as to form the loops 14.

These loops 14 can be subsequently used as electrical connection matrix plane terminals for connecting the terminals of circuit elements.

Figure 10:
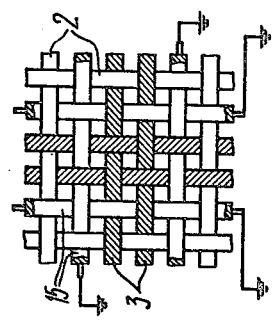
FIG. 10 is a plan view of a portion of an electrical connection matrix plane at a contact node site with additional insulated current conductors woven into the plane fabric, according to the invention.
Figure 11:
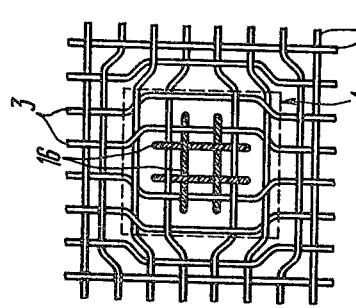
FIG. 11 is a plan view of a portion of an electrical connection matrix plane at a contact node side with additional insulation threads entering the electrical connection matrix plane fabric at the contact node site only, according to the invention.

In order to minimize stray currents induced in adjacent current conductors and also to shield the current conductors 3 themselves, additional insulated current conductors 15 (FIG. 10) are inserted in the electrical connection matrix plane which are extended parallel to the current conductors 3 (or groups of the current conductors 3) which are to be shielded.

These additional current conductors 15 run parallel to the current conductors 3 in place of the insulation threads 2 and repeat the interweaving pattern of said current conductors 3 to be shielded.

The additional current conductors 15 are earthed providing thereby shielding of both the current conductors 3 which are sources of stray currents and the current conductors 3 subject to the effect of strong stray currents.

With a view to obtaining optimum performance characteristics in making an electrical connection matrix plane on weaving equipment, the current conductors 3 and 15 are made from known current conducting threads with current-conducting fillers.

The mechanical characteristics of such current conducting threads are similar to the characteristics of the insulation threads 2 which helps obtain optimum performance of the loom in manufacturing a electrical connection matrix plane.

In order to provide ports at certain predetermined places required by general arrangement of the unit and design considerations, additional insulation threads 16 (FIG. II) running in the weft and warp directions should be provided in the course of weaving an electrical connection matrix plane on a loom.

These insulation threads 16 are not included in the general fabric of the insulation threads 2 and the current conductors 3, but are intertwined with the current conductors 3 only at the site of the contact node I as shown in FIG. II.

These additional insulation threads 16 are subsequently pulled out of the fabric so that ports 17 are formed in their place (FIG. 12) which are intended for passing therethrough the contact terminals of circuit elements.

Figure 13:
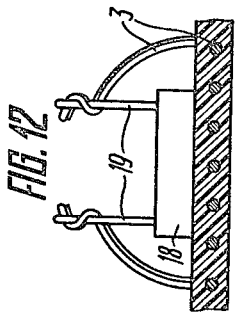
FIG. 13 is a side view of a circuit element connected to an electrical connection matrix plane without ports for terminals of a circuit element, according to the invention.

FIG. 13 shows a circuit element 18 mounted on an electrical connection matrix plane without ports. In this case, terminals 19 of the circuit element 18 are connected to the current conductors 3 on the same side of the electrical connection matrix plane where the circuit element 18 is positioned.

Figure 14:
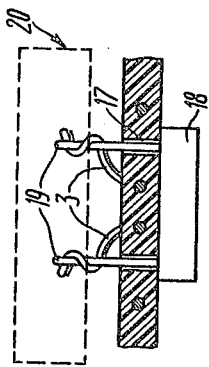
FIG. 14 is a side view of a circuit element with the terminals thereof connected to the terminals of an electrical connection matrix plane through ports made in the electrical connection matrix plane, according to the invention.

If an electrical connection matrix plane has the ports 17 (FIG. 14) through which the terminals 19 of the circuit element 18 are passed, the terminals 19 are connected to the current conductors 3 on the opposite side of the electrical connection matrix plane.

Thus all the circuit elements are mounted on one side of the electrical connection matrix plane, whereas all contact terminals are brought out at the other side of the electrical connection matrix plane which makes it possible to solder the connections on this side at a site 20 using the advanced flash soldering technique.

The proposed electrical connection matrix plane can be manufactured on conventional weaving equipment using conventional attachments for making all kinds of required modifications in the interweaving pattern of the current conductors 3 and threads 2 (FIG. 1). Note that the interweaving pattern illustrated in FIG. 1 is not the only one possible.

Any interweaving pattern may be employed provided it meets the condition that the current conductors 3 extended along the X and Y axes of the electrical connection matrix plane are disposed on different sides of the insulation field at their intersections.

Such operations as making the contact nodes I, arranging a layer of the current conductors 3 (FIG. 3) over the portion 7 of the insulation field 6, providing the loops 14 (FIG. 8) at the predetermined contact nodes I, inserting the additional insulated conductors 15 (FIG. 19), and also interweaving of the additional insulation threads 16 into the site of the required contact node I, are all performed through the use of well known and extensively used weaving techniques whereby each particular operation is accomplished in predetermined time at a preset place of the electrical connection matrix plane.

The electrical connection matrix plane of the present invention may be employed extensively in any modern electronic equipment and, in particular, in electric signal switching systems.

An important advantage of the electrical connection matrix plane which renders it applicable in a broad range lies in that circuit elements can be connected not only to the terminals on the perimeter of the electrical connection matrix plane, but also to terminals all over the plane area.

This is of great importance in electronic technology, since it allows to replace multi-layered printed-circuit boards by a cheaper and much more reliable electrical connection matrix plane without appreciable modifications of the unit design, for example, by simply locating on the area of a multi-layered printed-circuit board a proposed electrical connection matrix plane fastened to a stiffener.

This advantage is provided because at least one current conductor disposed at the site of the contact node I (FIG. 8) of the electrical connection matrix plane hangs loose above the contact node I in the form of the loop 14 (FIG. 9) of a certain size rather than being drawn tight into the fabric pattern. The loop 14 is a contact terminal and can be used for connecting circuit elements with both planar and end face terminals.

The same advantage is realized through formation of a layer of the loose-hanging current conductors 3 (FIG. 3) which emerge from the interwoven insulation layer 6 of the electrical connection matrix plane and reenter this layer after a certain spacing.

Cutting of the above loose-hanging current conductors 3 produces contact terminals of an electrical connection matrix plane (FIG. 5) which may be used for connection of circuit elements.

The difference between the above two types of terminals is that the loops 14 (FIG. 8) at the contact nodes I permit connection of circuit element terminals to the contact nodes only, whereas in the case of loose-hanging current conductors the terminals of circuit elements can be connected to electrical connection matrix plane contacts even in portions having no contact nodes I.

Such an electrical connection matrix plane is much easier to manufacture due to elimination of the manual operation of selecting current conductors from a general row of insulation threads and current conductors located along the perimeter of the electrical connection matrix plane.

This is made possible through changing the electrical connection matrix plane fabric in peripheral areas where contact terminals must be provided. In these areas the weft or warp current conductors 3 form a second layer over a layer of the insulation fabric produced by the warp and weft insulation threads 2, i.e. the X or Y current conductors emerge from the insulation fabric and reenter it only after a certain interval determined by the length of proposed contact terminals.

The above-mentioned section of the insulation fabric disposed under the current conductors may either be cut out or else preserved to serve as an insulation support.

This advantage is quite important because it completely obviates the need for manual selection and cutting-off of every insulation thread 2 running parallel to the current conductors 3.

The insulated current conductors 15 (FIG. 10) extending parallel to the current conductors 3 protect the conductors 3 from stray currents which appreciably expands the range of application of such electrical connection matrix planes in up-to-date switching equipment.

Apart from labour savings in making a proposed electrical connection matrix plane, optimum technology characteristics may be attained on weaving equipment.

This advantage is provided by replacement of the metal conductors 3 by current conducting threads made from an insulation material filled or coated with current conducting compounds and having mechanical characteristics similar to those of the insulation threads 2.

Finally, an important advantage of the electrical connection matrix plane is that it is possible to pass the terminals of circuit elements through the ports 17 (FIG. 12) of the electrical connection matrix plane and thereby enable using an advanced flash soldering technique for connecting the terminals of the circuit elements to the electrical connection matrix plane terminals.

What is claimed is:

1. An electrical woven electrical connection matrix plane made from interwoven insulation threads and X and Y current conductors assembled into groups, each group consisting of at least two said parallel current conductors extending along one axis and intersecting an insulation field formed by said interwoven insulation threads alternatingly, so that at intersections said current conductors running along opposite coordinate axes are disposed on different surfaces of said insulation field, contact nodes at preset intersections and in the form of a mesh comprised of interweaving of said current conductors of respective X and Y groups brought out at one surface of the insulation field, at least one portion of said electrical connection matrix plane having a loose-hanging layer of said parallel current conductors from several said groups extending along one axis positioned above the layer formed by insulation threads interwoven with several adjacent groups of said current conductors extending along the other axis; said loose hanging layer being provided for connecting circuit elements in portions having no contact nodes.

2. An electrical woven electrical connection matrix plane as set forth in claim 1, wherein at a site of said contact node at least one of said current conductors forming said node comprises a loop disposed above this contact node.

3. An electrical woven electrical connection matrix plane as set forth in claim 1, including additional insulated current conductors running parallel to said groups of current conductors requiring shielding.

4. An electrical woven electrical connection matrix plane as set forth in claim 1, wherein said current conductors comprise insulation threads impregnated with a current conducting compound.

5. An electrical woven electrical connection matrix plane as set in claim 1, wherein said contact nodes have central ports for terminals of circuit elements, said ports being formed after removal of additional insulation threads interwoven into the center of said contact nodes.

6. An electrical woven connection matrix plane as defined in claim 1, including additional insulated current conductors running parallel to said groups of current conductors requiring shielding, at a site of said contact node at least one of said current conductors forming said node comprises a loop disposed above this contact node, said current conductors comprise insulation threads impregnated with a current conducting compound, having central ports for terminals of circuit elements, said ports being formed after removal of additional insulation threads interwoven into the center of said contact nodes, groups of X and Y conductors intersecting the insulation field so that conductors re-enter the insulation seal while bypassing groups of conductors at a 90° angle and forming parallel conductors above the insulation field comprised of X and Y insulation threads interwoven with groups of conductors extending at 90° to the first-mentioned group of conductors.

* * * * *